United States Patent [19]
Mohwinkel et al.

[11] Patent Number: 5,942,957
[45] Date of Patent: *Aug. 24, 1999

[54] FLIP-MOUNTED IMPEDANCE

[75] Inventors: Clifford A. Mohwinkel, San Jose; Edwin F. Johnson, Sunnyvale; Edward B. Stoneham, Los Altos, all of Calif.

[73] Assignee: Endgate Corporation, Sunnyvale, Calif.

[ * ] Notice: This patent is subject to a terminal disclaimer.

[21] Appl. No.: 08/929,688

[22] Filed: Sep. 15, 1997

Related U.S. Application Data

[63] Continuation-in-part of application No. 08/662,693, Jun. 12, 1996, Pat. No. 5,668,512, and a continuation-in-part of application No. 08/478,375, Jun. 7, 1995, Pat. No. 5,528, 203, and a continuation of application No. 08/313,927, Sep. 26, 1994, abandoned.

[51] Int. Cl.$^6$ ....................................... H01P 5/12
[52] U.S. Cl. .......................... 333/128; 333/246; 361/784; 361/803
[58] Field of Search ...................... 333/128, 246, 333/247; 257/778; 361/738, 743, 782, 784, 803, 790

[56] References Cited

U.S. PATENT DOCUMENTS

| | | |
|---|---|---|
| 3,517,278 | 6/1970 | Hager . |
| 3,550,288 | 12/1970 | Asscher ............................. 257/778 X |
| 3,622,385 | 11/1971 | Stork . |
| 4,135,168 | 1/1979 | Wade . |
| 4,376,287 | 3/1983 | Sechi . |
| 4,430,623 | 2/1984 | Bert et al. . |
| 4,511,860 | 4/1985 | Bastida et al. . |
| 4,523,163 | 6/1985 | Houdart et al. . |
| 4,617,586 | 10/1986 | Cuvilliers et al. . |
| 4,626,805 | 12/1986 | Jones .................................. 333/246 X |
| 4,739,519 | 4/1988 | Findley . |
| 5,087,896 | 2/1992 | Wen et al. . |
| 5,105,171 | 4/1992 | Wen et al. . |
| 5,115,245 | 5/1992 | Wen et al. . |
| 5,132,641 | 7/1992 | Khandavalli . |
| 5,138,436 | 8/1992 | Koepf . |
| 5,194,833 | 3/1993 | Dougherty et al. . |
| 5,206,986 | 5/1993 | Arai et al. . |
| 5,528,203 | 6/1996 | Mohwinkel et al. . |
| 5,532,658 | 7/1996 | Tonegawa et al. ...................... 333/246 |
| 5,550,518 | 8/1996 | Mohwinkel ......................... 333/247 X |
| 5,719,749 | 2/1998 | Stopperan ........................... 361/803 X |

OTHER PUBLICATIONS

P. Wallace et al., "Flip–Chip BeO Technology Applied to GaAs Active Aperture Radars", *Microwave Journal*, Nov. 1982, pp. 109–113.

N. Takachio et al., A 10 Gb/s Optical Heterodyne Detection Experiment Using a 23 Ghz Bandwidth Balanced Receiver, 1990 IEEE MTT–S Digest, pp. 149–151.

J. Walker, "High–power GaAs FET Amplifiers", Intl. Standard Book No. 0–89006–479–2, © 1993 Artech House, Inc., pp. 87–90.

*Primary Examiner*—Paul Gensler
*Attorney, Agent, or Firm*—Anderson & Adamson

[57] ABSTRACT

A radio-frequency power amplifier includes a multiple-FET chip that is flip-mounted on a connection region of a substrate. An input impedance-matching network is also mounted on the substrate. The network includes a coplanar waveguide having an elongate waveguide signal conductor for each gate terminal on the FET chip with a distal end spaced from the connection region and a proximal end in the connection region. The distal ends are connected to a single base input conductor. The proximal ends are flip-mounted to respective ones of gate terminals of the FET chip. A capacitor couples each of the input signal conductor distal ends to an adjacent ground conductor. The signal conductors and capacitors provide a selected impedance at a selected frequency. The capacitors may be on a separate chip flip-mounted to the coplanar transmission line conductors, and may be formed as coplanar waveguides with open-ended signal conductors or as overlay capacitors. An output coplanar waveguide includes, for each drain terminal, an output signal conductor having an end in the connection region that is electrically connected to the flip-mounted FET chip. This waveguide also has a length selected to provide desired impedance matching.

25 Claims, 4 Drawing Sheets

FLIP-MOUNTED IMPEDANCE

CROSS-REFERENCE TO RELATED APPLICATIONS

This is a continuation-in-part of application Ser. No. 08/662,693, filed Jun. 12, 1996, now assigned U.S. Pat. No. 5,668,512, and is a continuation-in-part of application Ser. No. 08/478,375, filed Jun. 7, 1995, now U.S. Pat. No. 5,528,203, and is a continuation of application Ser. No. 08/313,927 filed on Sep. 26, 1994, now abandoned.

BACKGROUND OF THE INVENTION

1. Field of the Invention

This invention relates to high frequency coplanar circuit structures, and in particular to flip-mounting of passive circuit components onto coplanar conductors.

2. Related Art

Mounting integrated circuit flip-chips onto a motherboard has been found to be an effective way to connect radio frequency circuit components together. The use of flip-mounting provides a substitute attachment method that replaces the use of bond wires, backside metalization and vias, air bridges, and dielectric crossovers on the mother substrate. The conducting columns or bumps that connect the chip to the mother board can be formed using solder, brazing material or conductive adhesives. However, the preferred method is by thermocompression bonding because of the resulting reduced impact on losses and parasitics and improved consistency.

Also, in such high frequency applications, the use of coplanar transmission lines is well established. Typical examples include conventional coplanar waveguides (ground-signal-ground lines), slot lines, balanced ground-signal-signal-ground lines, and parallel-strip balanced lines. Coplanar transmission lines are particularly useful because of the simplified structure provided by having both signal and ground conductors on a single plane. Coplanar waveguides are particularly useful due to the access to the ground or signal-return planes on both sides of the signal conductor. Adjacent coplanar waveguides are known to be used to connect different flip-mounted circuits. The coplanar waveguides also provide improved isolation between signal conductors as compared to some other transmission line structures.

The flip-chip itself typically contains transistors. In a power chip, a plurality of transistors are often driven by a single control lead, such as the base or gate depending on the type of transistor involved. Correspondingly, the associated set of collectors or drains, i.e., current-carrying terminals, are joined to a single output terminal. Impedance-matching for the composite power transistor is accomplished on the mother board. Passive circuit components, typically some form of impedance, such as resistors, capacitors and inductors, are formed on the mother board with connections over circuit elements, such as conductors being by bond wires, air bridges and the like. These connecting structures introduce impedances as well. There thus remains a need for simplifying the interconnection between circuit components so that inherent circuit structure impedances are reduced.

SUMMARY OF THE INVENTION

It is found, as just noted, that an effectively large power transistor can be provided by a set of smaller transistors connected in parallel. However, this basic structure requires that input and output impedance matching be provided for the entire transistor. It is desirable to take advantage of flip-chip technology to provide power amplifiers and yet to provide matching separately for the individual transistors making up an associated power transistor. In the general sense, then, it is desirable to be able to provide matching on the mother board for the individual active devices on a transistor chip.

Accordingly, a flip-mounted impedance circuit structure made according to the invention includes a first electrically insulating substrate having a planar face and a first electrical circuit having first and second conductors mounted on the first substrate face. A second electrically insulating substrate also having a planar face is flip mounted relative to the first substrate with the first substrate planar face facing the second substrate planar face. A second electrical circuit is mounted relative to the second substrate and includes first and second terminals mounted on the second substrate face and a passive impedance component connected between the first and second terminals. The first terminal is flip-mounted onto the first conductor and the second terminal is flip-mounted onto the second conductor, whereby the second circuit conducts electrical current relative to the first circuit.

In the preferred embodiment, a single chip having multiple capacitors is flip-mounted onto a corresponding set of coplanar transmission lines, such as coplanar waveguides or slotlines, there being a capacitor connecting each signal conductor to at least one ground conductor. As used herein, coplanar waveguide refers to one or more signal lines between and coplanar with ground or return lines, and may have a backside ground plane or other metalization. Accordingly, slotlines are coplanar signal-signal lines, with the lines conducting balanced (push-pull) or unbalanced signals. Each coplanar waveguide thus has first and second, spaced-apart coplanar ground conductors, and a first signal conductor coplanar with the ground conductors and positioned between and spaced from the first and second ground conductors. The signal conductor includes a base portion and at least first and second spaced-apart branch portions. All of the signal conductors may be joined. Adjacent coplanar transmission lines may share adjacent conductors, and a complementary conductor preferably extends in between adjacent branch portions.

Each pair of adjacent capacitors share a common terminal that is mounted onto a signal conductor, providing impedance matching for a coplanar transmission line. By mounting the capacitors on a junction in a signal line, a single signal-conductor terminal provides impedance connection for two coplanar waveguides, with one ground terminal contact associated with a shared conductor between the adjacent coplanar waveguides. The capacitors are preferably formed as coplanar waveguides with open-ended signal conductors, overlay capacitors, or equivalent forms of capacitors. These waveguides have a length and other dimensions selected to provide desired impedance matching.

The invention thus provides for the advantageous use of flip-mounting radio frequency chips directly onto coplanar conductors, providing thereby reduced connecting component parasitic impedances and a compact design, since selected impedances can be taken off of the mother board and yet not necessarily included on an expensive GaAs active device chip. Where multiple input or output lines are used, a single passive impedance chip is provided with a plurality of impedances between selected conductors on the mother board. These and other features and advantages of the present invention will be apparent from the preferred embodiments described in the following detailed description and illustrated in the accompanying drawings.

DETAILED DESCRIPTION OF THE PREFERRED EMBODIMENT

Figure 1:
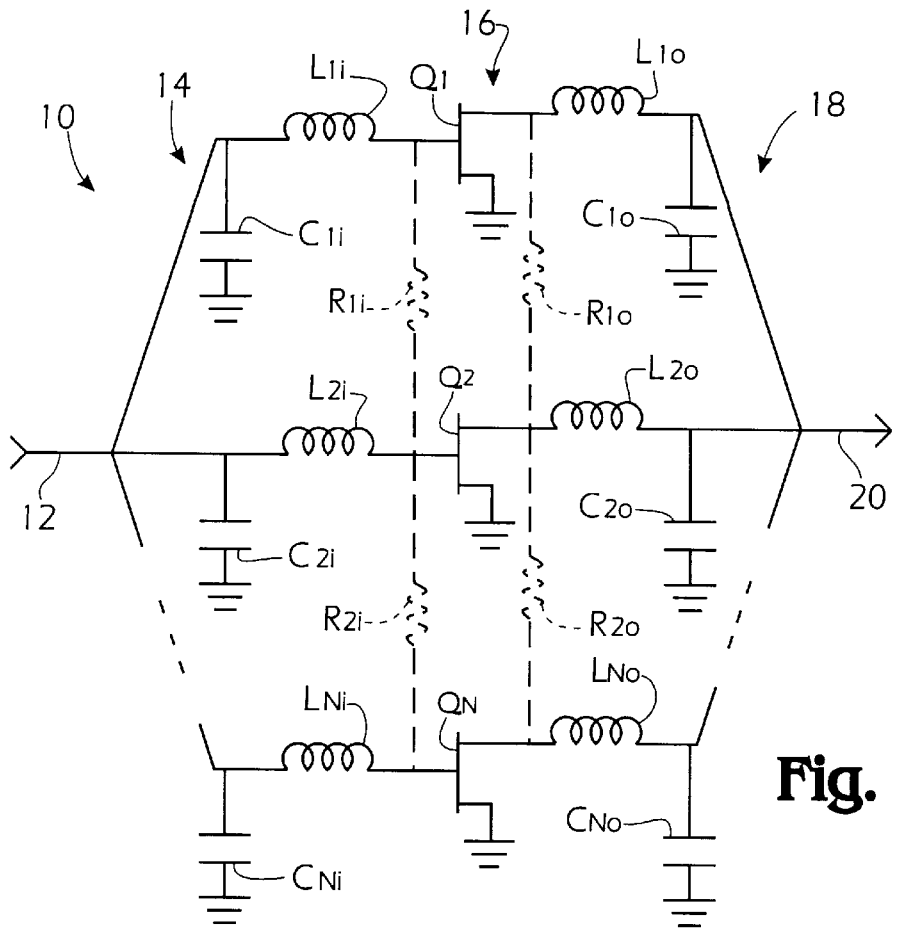
FIG. 1 is a schematic of an impedance-matched power amplifier that may be made according to the invention.

Referring initially to FIG. 1, an exemplary power amplifier 10 is shown that illustrates an electrical circuit that may be made according to the invention. Amplifier 10 includes a single input signal line 12 that is received by an input impedance-matching network 14 for matching the input impedance of a composite transistor 16 to an input circuit. Correspondingly, an output impedance-matching network 18 matches the composite transistor output impedance to an output circuit connected to a single output signal line 20.

The amplifier is comprised of N sections. The input impedance-matching circuit for each section I includes a shunt capacitance $C_{ii}$ and a series inductance $L_{ii}$, which in radio frequency applications is typically in the form of a transmission line. Isolation for odd mode oscillations may be provided by isolation resistors $R_{ii}$ in the input circuit between sections, and may be provided in the output circuit as shown by resistors $R_{io}$. Correspondingly, the output impedance-matching circuit includes, for each section I, a series inductance $L_{io}$ and a shunt capacitance $C_{io}$.

Each section I has a transistor $Q_i$. These are shown in the preferred form as FETs, although they may be bipolar transistors as well. The set of transistors $Q_i$, I=1, 2, . . . N, form, in concert composite transistor 16. As will be seen with regard to specific embodiments of the invention, the gates, sources and drains may be unbroken. That is, they may be sections of corresponding composite elements.

Figure 2:
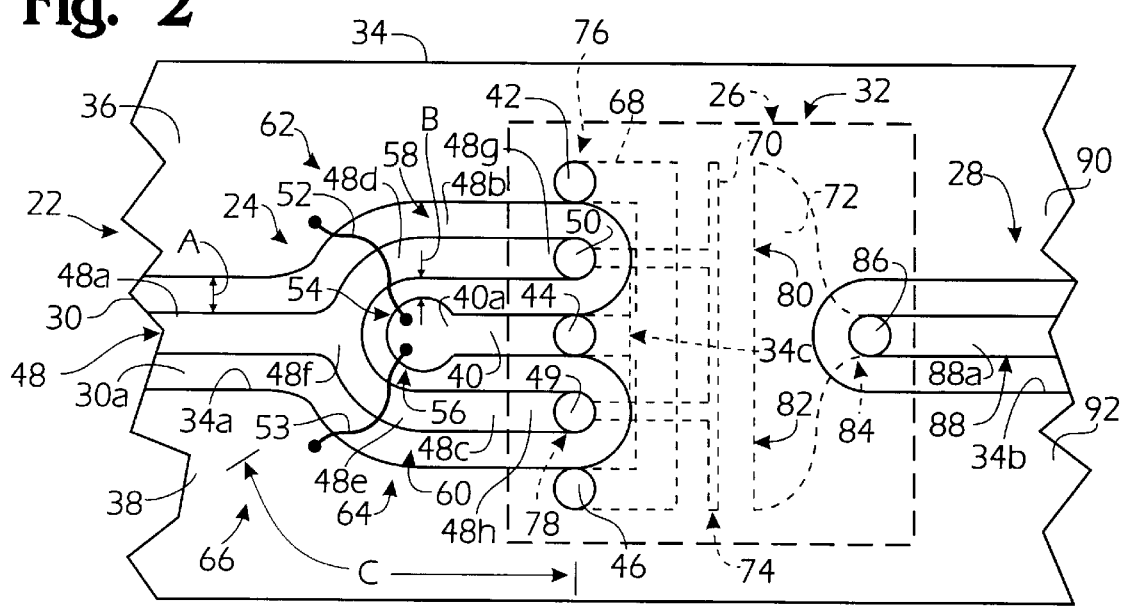
FIG. 2 is a plan view of a first embodiment of an amplifier of FIG. 1.

FIG. 2 illustrates an amplifier 22 that includes an input or first coplanar waveguide 24, a flip-mounted FET chip 26, also referred to as a circuit component, shown in dashed lines, and an output or second coplanar waveguide 28, all mounted relative to a substrate 30. The substrate includes a planar face 30a and has what is referred to as a connection region 32 defined generally by the outline of FET chip 26.

Mounted on substrate 30 is a ground plane 34 that includes first, second and third ground conductors 36, 38 and 40. Third ground conductor 40 is elongate and has an enlarged input or distal end 40a. These three ground conductors are all preferably integrally joined in the connection region as shown. Electrically conductive flip-mounting bumps 42, 44 and 46 connect the ground conductors to corresponding source terminals of FET chip 26 located in connection region 32.

Extending in a slot 34a in the ground plane is an input or first signal conductor 48 that is spaced from ground conductors 36, 38 and 40 by a generally uniform or average (per unit length of conductor 48) distance A. Ground conductor 40 may not be required, as represented by alternative ground plane edge 34c shown as a dotted line, such as when conductor 48 is closely coupled to conductors 36 and 38. The input signal conductor includes a single input base portion 48a and first and second branch portions 48b and 48c. These branch portions are connected at what are referred to as input or distal ends 48d and 48e at a junction 48f to base portion 48a. Output or proximal ends 48g and 48h are connected to gate terminals of FET chip 26 via flip-chip bumps 49 and 50. Enlarged end 40a of ground conductor 40 is connected to the adjacent sections of ground conductors 36 and 38 by suitable air bridges 52 and 53, or by equivalent structure.

The enlarged end of ground conductor 40 is seen to be spaced a distance B from distal ends 48d and 48e of the input signal conductor that is less than distance A. This reduced spacing results in increased capacitances 54 and 56 between the associated sections of the ground conductor and the branch portions of the input signal conductor. This reduced spacing could also be achieved by enlarging the signal conductor, such as a stepped or a gradual increase in size. These capacitances correspond to capacitances $C_{1i}$ and $C_{2i}$ shown in amplifier 10 of FIG. 1. Similarly, the length C of branch portions 48b and 48c comprise transmission lines 58 and 60 that correspond to inductances $L_{1i}$ and $L_{2i}$ of amplifier 10. Capacitance/inductance combinations 54/58 and 56/60 thus form individual impedance-matching circuits 62 and 64, respectively, that together comprise a composite input impedance-matching circuit 66. Other techniques, such as placing dielectric layers over the conductors or adding backside metalization may also be used for impedance matching.

FET chip 26 may be constructed according to conventional techniques. It includes a source 68, a gate 70 and a drain 72 which form a composite FET 74. Source 68 is connected in this embodiment to flip-chip bumps 42, 44 and 46. These bumps thus form a set 76 of terminals that serve to connect source 68 to ground. Gate 70 is connected to bumps 49 and 50 on which an input signal is received from signal conductor 48. Bumps 49 and 50 accordingly may be considered a set 78 of control terminals for individual FETs 80 and 82. Drain 72 is connected to a set 84 of output current terminals, consisting in this embodiment of a single output current terminal represented by a flip-chip bump 86.

As is seen, bump 86 is connected to what may be considered the proximal end 88a of a second or output signal conductor 88. Conductor 88 is positioned in a slot 34b of the ground plane and is spaced a distance A on opposite sides from fourth and fifth ground conductors 90 and 92, which together form output coplanar waveguide 28. Although not shown as being the same, impedance matching may be provided on the output using the techniques described with reference to the input.

Figure 3:
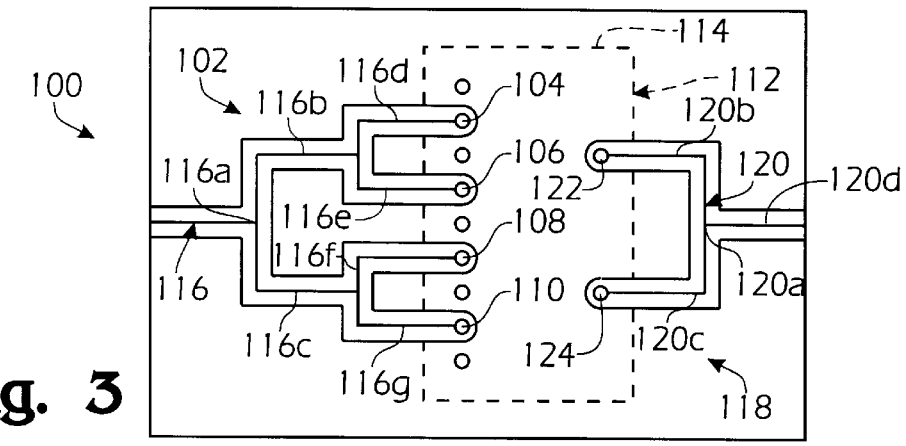
FIG. 3 is a simplified plan view of a second embodiment that is an extension of the embodiment of FIG. 2.

FIG. 3 illustrates, in simplified form an amplifier 100 that is similar to amplifier 22. Amplifier 100 includes an input coplanar waveguide 102 that has four terminations 104, 106, 108, and 110 in a connection region 112 associated with a transistor chip 114. Waveguide 102 is in the form of a binary division with a first junction 116a dividing a signal conductor 116 into initial branch portions 116b and 116c. Each of branch portions 116b and 116c then divides into respective branch portions 116d, 116e, 116f and 116g.

Similarly, an output coplanar waveguide 118 has an output signal conductor 120 that joins at a junction 120a from two branch portions 120b and 120c into a single output base portion 120d. Branch portions 120b and 120c are joined to chip 114 at terminals 122 and 124.

Figure 4:
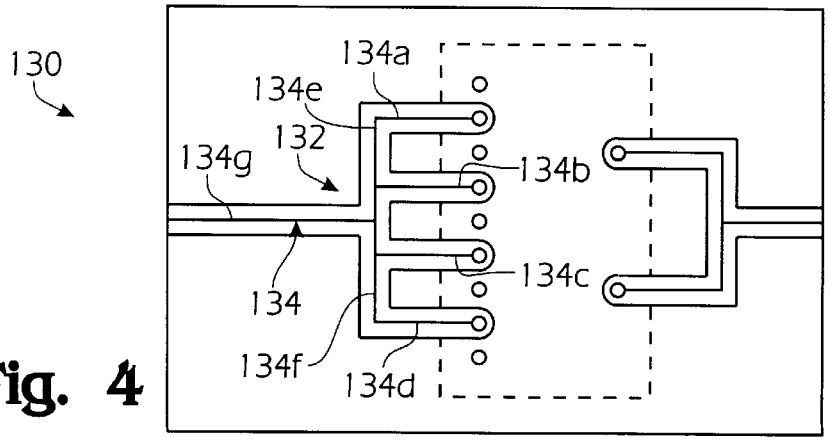
FIG. 4 is a plan view similar to FIG. 3 showing a third amplifier embodiment.

FIG. 4 illustrates an amplifier 130 that is similar to FIG. 3 except for the shape of an input coplanar waveguide 132. This waveguide has an input signal conductor 134 that divides directly into four parallel branch portions 134a, 134b, 134c and 134d from oppositely directed junction arms 134e and 134f extending from a base portion 134g.

As is apparent other junction configurations are possible for a coplanar waveguide having a split signal path. Also, the splits into multiple branch portions may be made non-symmetrical in order to divide the power unequally.

Figure 6:
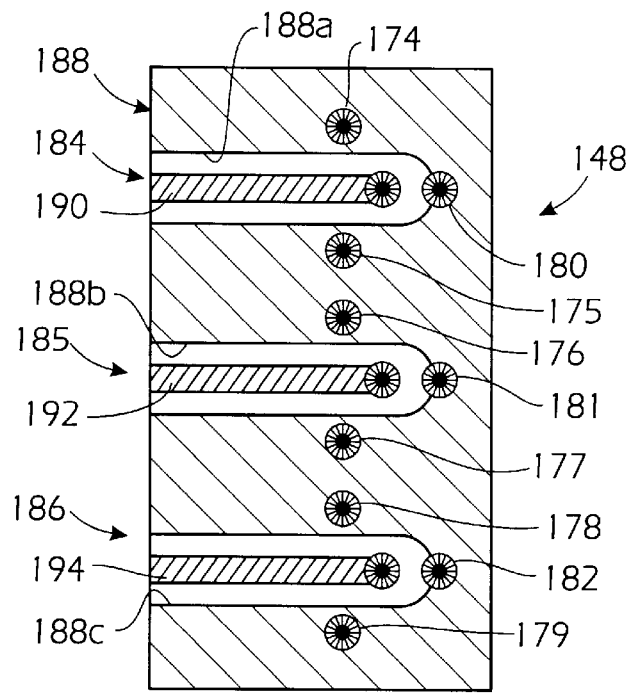
FIG. 6 is a scale cross-section view of a capacitor flip-chip used in the embodiment of FIG. 5.
Figure 5:
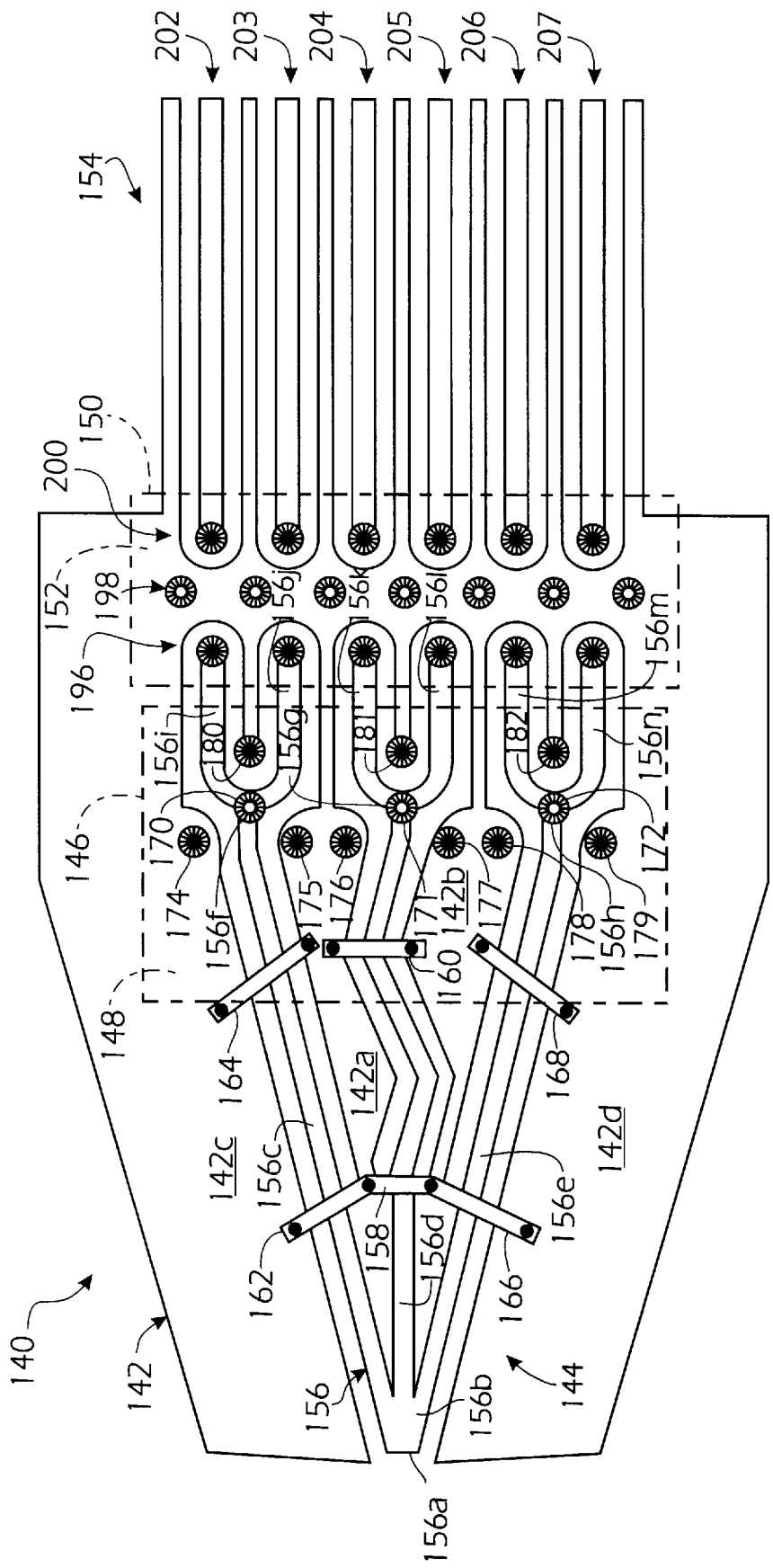
FIG. 5 is a scale plan view of yet a fourth amplifier embodiment, this embodiment including a flip-mounted impedance according to the invention.

FIGS. 5 and 6 are plan views of a preferred design of an amplifier 140 that is an embodiment of a flip-mounted impedance according to the invention. For simplicity the substrate on which the coplanar waveguides are mounted is not shown. Amplifier 140 includes an integral ground plane 142 that forms a multiple-split-path input coplanar waveguide 144 that extends through a first flip-chip connection region 146. Region 146 is for connecting a capacitor chip 148. Waveguide 144 terminates in a second flip-chip connection region 150 in which it is connected to a FET chip 152. A split-path output coplanar waveguide 154 extends from region 150.

Input coplanar waveguide 144 is like the combination of three waveguides like waveguide 24 illustrated in FIG. 2. This waveguide includes an input signal conductor 156 having an initial base section 156a. This section immediately splits at a junction 156b into three primary branch portions 156c, 156d and 156e having substantially equal lengths. These branch portions then each divide at respective junctions 156f, 156g and 156h into respective parallel secondary branch portions 156i and 156j, 156k and 156l, and 156m and 156n. Each of these latter branch portions forms a transmission line segment having inherent inductance, as has been described with regard to the embodiment of FIG. 2.

These split signal conductors divide the ground plane into intermediate portions 142a and 142b positioned between the adjacent primary branch portions 156c, 156d and 156e. Air bridges 158 and 160 connect these ground portions together at spaced locations. Similarly, air bridges 162 and 164 connect ground portion 142a with a first base ground portion 142c, and air bridges 166 and 168 connect ground portion 142b with a second base ground portion 142d. Alternatively, chip 148 could be extended over the primary branch portions with appropriate metalization and flip-connections for providing the ground cross-over connections instead of the air bridges.

Flip-chip bumps 170, 171 and 172 for capacitor chip 148 are located on input signal conductor junctions 156f, 156g and 156h. Also, flip-chip bumps 174, 175, 176, 177, 178, 179, 180, 181 and 182 connect the various ground plane portions with flip-chip 148. Chip 148 is shown in a simplified top view in FIG. 6 as it would be viewed on the dash-dot footprint of the chip shown in FIG. 5 with cross-section hatching showing metalization. For simplicity, the flip-chip bumps shown in FIG. 6 are given the same numbers as shown in FIG. 5.

It is seen that chip 148 has three coplanar waveguides 184, 185 and 186. Ground plane 142 is connected through the associated bumps to a chip ground plane 188 having slots 188a, 188b and 188c that have open-ended signal conductors 190, 192 and 194. These conductors are connected at one end to bumps 170–172. Waveguides 184, 185 and 186 thus provide capacitance between the secondary branch portions of signal conductor 156 and the three ground plane portions adjacent to each of junctions 156f, 156g and 156h. As was described with reference to amplifier 22 in FIG. 2, the capacitances and inductances are selected to provide impedance matching between an input circuit to which the amplifier is connected and the impedances of the FETs on chip 152.

FET chip 152 has a gate terminal at the end of each signal conductor 156 secondary branch portion. The set of gate terminals are represented generally by bumps 196. The source terminals are represented by bumps 198. Correspondingly, there is a drain terminal for each gate terminal, as represented by bumps 200. FIG. 5 shows output waveguides 202, 203, 204, 205, 206 and 207 extending from connection region 150, there being an output coplanar waveguide for each drain terminal. Again these output waveguides are transmission lines that provide impedance matching for the FETs on chip 152. The output signal paths may be joined after sufficient inductance is realized, or may diverge for subsequent individual signal processing according to the requirements of the specific application in which amplifier 140 is used.

Figure 7:
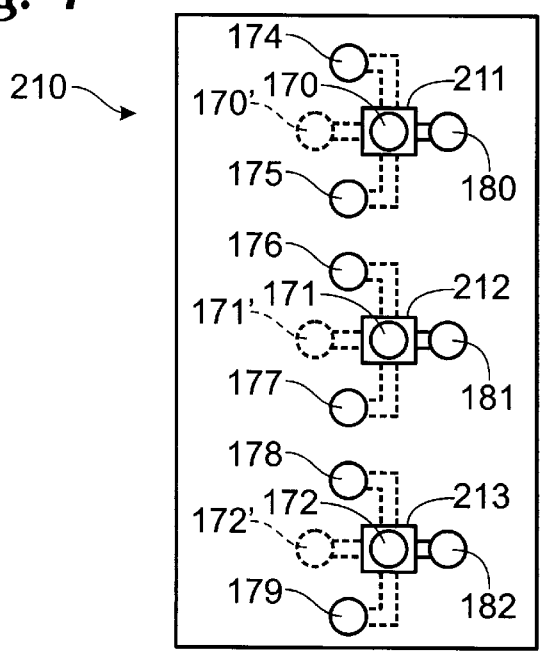
FIG. 7 is a plan view of an overlay capacitor flip-chip that could be used in place of the chip of FIG. 6.

FIG. 7 shows an alternative form of a capacitor chip 210 that can replace capacitor chip 148 shown in FIG. 6. Accordingly, for simplicity, the flip-chip bumps shown in FIG. 7 are given the same numbers as shown in FIGS. 5 and 6. In this embodiment, rather than using the open-ended coplanar waveguides to provide the capacitances, overlay capacitors are used. Overlay capacitors consist of dielectrically spaced conductive pads that are stacked generally normal to the plane of the chip substrate. In particular, bumps 170, 171 and 172 are mounted on the associated lower pads of overlay capacitors 211, 212 and 213, respectively. Ground conductor bumps 174, 175 and 180 are connected to the upper pad of capacitor 211. Similarly, ground conductor bumps 176, 177 and 181 are connected to the upper pad of capacitor 212, and ground conductor bumps 178, 179 and 182 are connected to the upper pad of capacitor 213, as shown.

The signal conductor bumps could also be located away from the overlay capacitors. This is illustrated by the alternative positions of bumps 170, 171 and 172 represented by bumps 170', 171' and 172' shown in dotted lines.

Figure 8:
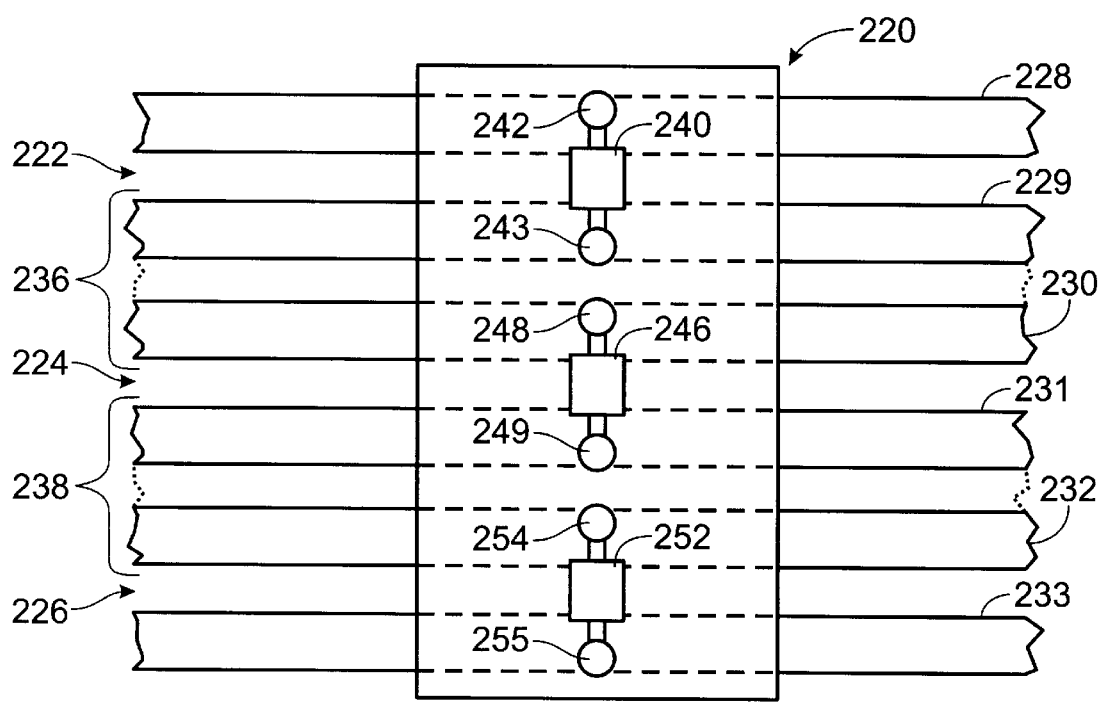
FIG. 8 is a plan view of an overlay capacitor flip-chip for use on coplanar slotlines.

Overlay capacitors are also advantageously used in a capacitor chip, such as chip 220 shown in FIG. 8, flip-mounted onto a plurality of slotlines 222, 224 and 226. Slotlines 222, 224 and 226 are formed by adjacent conductors 228 and 229, 230 and 231, and 232 and 233. The signals on adjacent conductors of adjacent slotlines, such as the signals on conductors 229 and 230, could be conducted by a single shared conductor. Such shared conductors are represented by conductors 236 and 238. Such a structure is convenient when the slotlines are branched similar to the branching of the coplanar waveguides shown in FIGS. 3, 4 and 5.

Chip 220 includes an overlay capacitor for each slotline. A capacitor 240 is connected to conductors 228 and 229 of slotline 222 by respective flip-chip bumps 242 and 243. Similarly, a capacitor 246 is connected to conductors 230 and 231 of slotline 224 by respective flip-chip bumps 248 and 249, and a capacitor 252 is connected to conductors 232 and 233 of slotline 226 by respective flip-chip bumps 254 and 255. Since the configuration of bumps shown would not provide a stable support for chip 220, support bumps, not shown, on the corners of the chip and located off of the slotlines, or bumps positioned at other selected locations, depending on the application, could also be used to provide the necessary stability.

The present invention thus provides for the dividing of a single signal path into plural signal paths using coplanar waveguide or slotline transmission line structure, or conversely for the combining of several signal paths into one. Manufacturing of the circuit is facilitated by having both ground and signal conductors on the same surface of a substrate, although intermediate connections between separated ground plane conductors is maintained through the use of noncoplanar techniques, such as air bridges, in order to connect like conductors. Further, appropriate design of the split signal paths provides selected amounts of series inductance and shunt capacitance for impedance matching. Capacitance and inductance are thus readily accommodated by a combination of coplanar design techniques and by a flip mounting an impedance chip to a coplanar transmission line.

It will be apparent to one skilled in the art that variations in form and detail may be made in the preferred embodiments without varying from the spirit and scope of the invention as defined in the claims and any modification of the claim language or meaning as provided under the doctrine of equivalents. For instance, the embodiments described provide different configurations for splitting the signal path of a coplanar waveguide and achieving impedance matching through coplanar and flip-chip circuit components. The preferred embodiments are thus provided for purposes of explanation and illustration, but not limitation.

I claim:

1. A flip-mounted impedance circuit structure comprising:
   a first electrically insulating substrate having a planar first substrate face with a connection region;
   a first electrical circuit having first and second conductors mounted on said first substrate face, said first and second conductors each having first and second conductor ends spaced distally of the connection region, and intermediate conductor portions extending through the connection region between said conductor ends;
   a second electrically insulating substrate having a planar second substrate face, said second substrate being flip mounted relative to said first substrate with said second substrate face facing the connection region of said first substrate face; and
   a second electrical circuit on said second substrate, said second circuit comprising first and second terminals mounted on said second substrate face and a first passive impedance coupling said first and second terminals, said first terminal being flip mounted onto said intermediate conductor portion of said first conductor and said second terminal being flip mounted onto said intermediate conductor portion of said second conductor, said second circuit conducting electrical current relative to said first circuit.

2. A circuit structure according to claim 1 wherein said first electrical circuit comprises a coplanar transmission line mounted on said first substrate face and said first and second conductors are conductors of said transmission line.

3. A circuit structure according to claim 2 wherein said transmission line is a coplanar waveguide having a signal conductor and a ground conductor on each side of the signal conductor, said first conductor being one of said ground conductors and said second conductor being said signal conductor.

4. A circuit structure according to claim 1 wherein said impedance is a capacitor.

5. A circuit structure according to claim 4 wherein said capacitor is in the form of an open-ended transmission line.

6. A circuit structure according to claim 5 wherein said open-ended transmission line is a coplanar waveguide having two ground conductors that are coupled together.

7. A circuit structure according to claim 4 wherein said capacitor is an overlay capacitor.

8. A circuit structure comprising:
   a first electrically insulating substrate having a planar first substrate face with a connection region;
   a first electrical circuit having a coplanar waveguide mounted on said first substrate face with first, second and third conductors, the first and third conductors being ground conductors and the second conductor being a signal conductor, said first, second and third conductors each having first and second conductor ends spaced distally of the connection region, and intermediate conductor portions extending through the connection region between said conductor ends;
   a second electrically insulating substrate having a planar second substrate face, said second substrate being flip mounted relative to said first substrate with said second substrate face facing said first substrate face; and
   a second electrical circuit on said second substrate, said second circuit comprising first, second and third terminals mounted on said second substrate face, and passive impedance coupling said first and second terminals and coupling said second and third terminals, said first terminal being flip mounted onto said intermediate conductor portion of said first conductor, said second terminal being flip mounted onto said intermediate conductor portion of said second conductor, and said third terminal being flip mounted onto said intermediate conductor portion of said third conductor, said second circuit conducting electrical current relative to said first circuit.

9. A circuit structure according to claim 8 wherein said impedance is in the form of an open-ended coplanar waveguide.

10. A circuit structure according to claim 8 wherein said impedance is capacitance.

11. A circuit structure according to claim 10 wherein said capacitance is an overlay capacitor.

12. A flip-mounted impedance circuit structure comprising:
   a first electrically insulating substrate having a planar first substrate face;
   a first electrical circuit having a slotline with first and second opposing conductors mounted on said first substrate face;
   a second electrically insulating substrate having a planar second substrate face, said second substrate being flip mounted relative to said first substrate with said second substrate face facing said first substrate face; and
   a second electrical circuit on said second substrate, said second circuit comprising first and second terminals mounted on said second substrate face and passive impedance coupling said first and second terminals, said first terminal being flip mounted onto said first conductor and said second terminal being flip mounted onto said second conductor, said second circuit conducting electrical current relative to said first circuit.

13. A flip-mounted impedance circuit structure comprising:
   a first electrically insulating substrate having a planar first substrate face;

a first electrical circuit having first, second, third and fourth conductors mounted on said first substrate face;

a second electrically insulating substrate having a planar second substrate face, said second substrate being flip mounted relative to said first substrate with said second substrate face facing said first substrate face; and a second electrical circuit on said second substrate, said second circuit comprising first, second, third and fourth terminals mounted on said second substrate face, a first passive impedance coupling said first and second terminals, and a second passive impedance coupling said third and fourth terminals, said first, second, third and fourth terminals being flip mounted, respectively, onto said first, second, third and fourth conductors, said second circuit conducting electrical current relative to said first circuit.

14. A circuit structure according to claim 13 wherein said first and second conductors comprise a first coplanar transmission line and said third and fourth conductors comprise a second coplanar transmission line.

15. A circuit structure according to claim 14 wherein said first and second transmission lines are respective first and second coplanar waveguides each having a signal conductor and a ground conductor on each side of the signal conductor, said first and third conductors being ground conductors and said second and fourth conductors being signal conductors.

16. A circuit structure according to claim 14 wherein said first and second transmission lines are respective first and second slotlines each having a pair of opposing conductors, said first and second conductors being the opposing conductors of said first slotline and said third and fourth conductors being the opposing conductors of said second slotline.

17. A circuit structure according to claim 13 wherein said second and fourth conductors are joined at a junction.

18. A circuit structure according to claim 17 wherein said junction is positioned distally of said second circuit.

19. A circuit structure according to claim 17 wherein said first terminal is flip mounted onto said junction.

20. A flip-mounted impedance circuit structure comprising:

a first electrically insulating substrate having a planar first substrate face;

a first electrical circuit having at least first and second coplanar waveguides mounted on said first substrate face formed by at least first, second and third ground conductors and first and second respective signal conductors;

a second electrically insulating substrate having a planar second substrate face, said second substrate being flip mounted relative to said first substrate with said second substrate face facing said first substrate face; and a second electrical circuit on said second substrate, said second circuit comprising at least four terminals mounted on said second substrate face and at least two capacitors, with each capacitor coupled to at least a corresponding pair of said terminals, said terminals being mounted to a respective one of said ground and signal conductors, there being a capacitor connecting each signal conductor to at least one ground conductor, said second circuit conducting electrical current relative to said first circuit.

21. A circuit structure according to claim 20 wherein each of said first and second signal conductors divide into branch portions at a junction.

22. A circuit structure according to claim 21 wherein said terminals mounted to said first and second signal conductors are flip mounted onto said respective junctions.

23. A circuit structure according to claim 20 wherein said capacitors are in the form of open-ended coplanar waveguides.

24. A circuit structure according to claim 23 wherein said open-ended waveguides have ground conductors that are integrally joined.

25. A circuit structure according to claim 20 wherein said capacitors are overlay capacitors.

\* \* \* \* \*